United States Patent [19]
Tomita

[11] Patent Number: 5,936,429
[45] Date of Patent: Aug. 10, 1999

[54] INTERFACE CIRCUIT AND METHOD FOR TRANSMITTING BINARY LOGIC SIGNALS WITH REDUCED POWER DISSIPATION

[75] Inventor: Takashi Tomita, Tokyo, Japan

[73] Assignee: Oki Electric Industry Co., Ltd., Tokyo, Japan

[21] Appl. No.: 08/825,464

[22] Filed: Mar. 28, 1997

[30]  Foreign Application Priority Data

Sep. 19, 1996 [JP] Japan ................................. 8-247320

[51] Int. Cl.[6] .............................................. H03K 19/0175
[52] U.S. Cl. .............................. 326/82; 326/26; 326/86
[58] Field of Search ................................. 326/82–83, 86, 326/26–27, 17, 59–60

[56]  References Cited

U.S. PATENT DOCUMENTS

| | | |
|---|---|---|
| 4,027,152 | 5/1977 | Brown et al. . |
| 4,585,958 | 4/1986 | Chung et al. ............................. 326/56 |
| 4,723,082 | 2/1988 | Asano et al. . |
| 5,023,488 | 6/1991 | Gunning ................................... 326/86 |
| 5,384,808 | 1/1995 | Van Brunt et al. ....................... 326/56 |

FOREIGN PATENT DOCUMENTS

| | | |
|---|---|---|
| 0 307 345 A1 | 3/1989 | European Pat. Off. . |
| 0 398 098 | 5/1990 | European Pat. Off. . |
| 0 449 251 A2 | 10/1991 | European Pat. Off. . |
| 0 575 124 A2 | 6/1993 | European Pat. Off. . |
| 1131417 | 10/1968 | United Kingdom . |

OTHER PUBLICATIONS

Das HP–IL–System Einführung in die Hewlett–Packard Interface–Schleife, Gerry Kane, Steve Harper and David Ushijima, 1984.

Data Compression, Techniques and Applications, Hardware and Software Considerations, Second Edition, Gilbert Held and Thomas R. Marshall, 1987.

"100 Mhz ni totsunyu shita maikuropurosasa, CPU bodo sekkei ga kawaru" (Microprocessors hit 100 MHz, CPU bo change), Nikkei Electronics No. 556, Jun. 8, 1992.

Center–Tap–Terminated (CTT) Low–Level, High–Speed Interface Standard for Digital Integrated Circuits, JEDEC Standard JESD8–4, Electronic Industries Association, Nov. 1993.

*Primary Examiner*—Jon Santamauro
*Attorney, Agent, or Firm*—Rabin & Champagne, P.C.

[57]  ABSTRACT

An interface circuit and method for transmitting a binary logic signal from a first electronic circuit to a second electronic circuit over a transmission line coupled to said first electronic circuit by a first terminal and to said second electronic circuit by a second terminal. The interface circuit transmits the binary logic signal by transmitting a pulse at a first potential at each falling transition of the binary logic signal, and a pulse at a second potential at each rising transition of the binary logic signal. At other times, the output terminal of a driver circuit is placed in a high-impedance state. A receiver circuit outputs a first logic Level upon receiving a pulse at the first potential, and outputs a second logic level upon receiving a pulse at the second potential. Output of these logic levels is maintained until the next pulse is received. The transmission line is preferably terminated at a potential intermediate between the first and second potentials.

27 Claims, 9 Drawing Sheets

INTERFACE CIRCUIT AND METHOD FOR TRANSMITTING BINARY LOGIC SIGNALS WITH REDUCED POWER DISSIPATION

BACKGROUND OF THE INVENTION

The present invention relates to a method of transmitting binary logic signals between electronic circuits, and an interface circuit implementing this method.

Despite the rapid progress of semiconductor technology, the number of transistors in an integrated circuit (hereinafter, IC) remains finite, and different system functions are often best implemented in different ICs. An electronic system such as a computer therefore usually comprises a plurality of ICs interconnected on a printed-circuit board. The input-output circuits of these ICs send and receive signals at various standardized voltage levels, such as the transistor-transistor-logic (TTL) level and low-voltage TTL (LVTTL) level employed for bipolar ICs, and the complementary metal-oxide-semiconductor (hereinafter, CMOS) level and low-voltage CMOS (LVCMOS) level employed for CMOS ICs. TTL and LVTTL interface circuits (drivers) produce output voltage swings of approximately two volts. CMOS and LVCMOS drivers produce output voltage swings equal to the power-supply voltage, typically five volts (5 V) or 3.3 V.

With the increasing signal speeds of electronic systems, however, transmission-line effects such as signal reflection and ringing, and noise effects such as crosstalk and ground bounce, create severe problems in the design of interconnections on printed-circuit boards. One solution to these problems is impedance-matching termination of the signal transmission lines, which reduces reflection and ringing. Another solution is to reduce the voltage swing of the signals, which reduces crosstalk and ground bounce.

These solutions have been adopted in recent interface standards such as the Center-Tap-Terminated (CTT) Low-Level, High-Speed Interface Standard for Digital Integrated Circuits published in November 1993 by the Electronic Industries Association, referred to below as the CTT standard. For a signal line with fifty-ohm termination, the CTT standard specifies a typical termination voltage and reference voltage of 1.5 V, with a high output logic level of from 1.9 V to 2.1 V and a low output logic level of from 0.9 V to 1.1 V. The output voltage swing is accordingly in the range from 0.8 V to 1.2 V. These output levels and termination conditions enable a binary logic signal with a bit rate exceeding one hundred million bits per second, or a clock signal with a frequency exceeding one hundred megahertz (100 MHz), to be transmitted with little distortion and without generating troublesome electrical noise.

In terms of power dissipation, however, CTT and similar interface schemes leave much to be desired. In the CTT interface, since both the high and low output potentials differ from the termination potential, current flows at all times between the driver circuit and the termination voltage source, dissipating direct-current (DC) power in the driver circuit and termination resistor. This DC power accounts for a major share of the total power dissipated by the interface.

SUMMARY OF THE INVENTION

It is accordingly an object of the present invention to reduce the power dissipation of high-speed binary-logic-signal interface circuits.

Another object of the invention is to reduce the current consumption of high-speed binary-logic-signal interface circuits.

Still another object is to avoid latch-up of CMOS high-speed binary-logic-signal interface circuits.

The invented interface circuit transmits a binary logic signal from a first electronic circuit to a second electronic circuit by means of a driver circuit, a receiver circuit, and a transmission line. At each rising transition of the binary logic signal, the driver circuit outputs a brief pulse at a first potential from an output terminal coupled to the transmission line. At each falling transition of the binary logic signal, the driver circuit outputs a brief pulse at a second potential from the output terminal. When no transition occurs in the binary logic signal, the driver circuit places the output terminal in the high-impedance state. Power dissipation in the driver circuit is thereby limited to the brief intervals during which pulses are output.

Upon receiving a pulse at the first potential from the transmission line, the receiver circuit outputs a first logic level to the second electronic circuit. Output of the first logic level is maintained until a pulse at the second potential is received. Upon receiving a pulse at the second potential from the transmission line, the receiver circuit outputs a second logic level to the second electronic circuit. Output of the second logic level is maintained until a pulse at the first potential is received.

The transmission line is preferably terminated at a potential intermediate between the first potential and second potential. The receiver circuit can then compare the potential received from the transmission line with a reference potential that is adjusted responsive to the output of the receiver circuit. The reference potential is adjusted to a potential intermediate between the termination potential and second potential when a pulse at the first potential is received, and is adjusted to a potential intermediate between the first potential and termination potential when a pulse at the second potential is received.

The termination resistance preferably matches the characteristic impedance of the transmission line, and the voltage swing between the first and second potentials is preferably less than the power-supply voltage on which the first and second electronic circuits operate.

DETAILED DESCRIPTION OF THE INVENTION

Embodiments of the invention in the form of CMOS interface circuits will be described with reference to the attached illustrative drawings. The CMOS ICs between which signals are transmitted will be assumed to operate on a power-supply potential Vdd of 3.3 V below.

Figure 1:
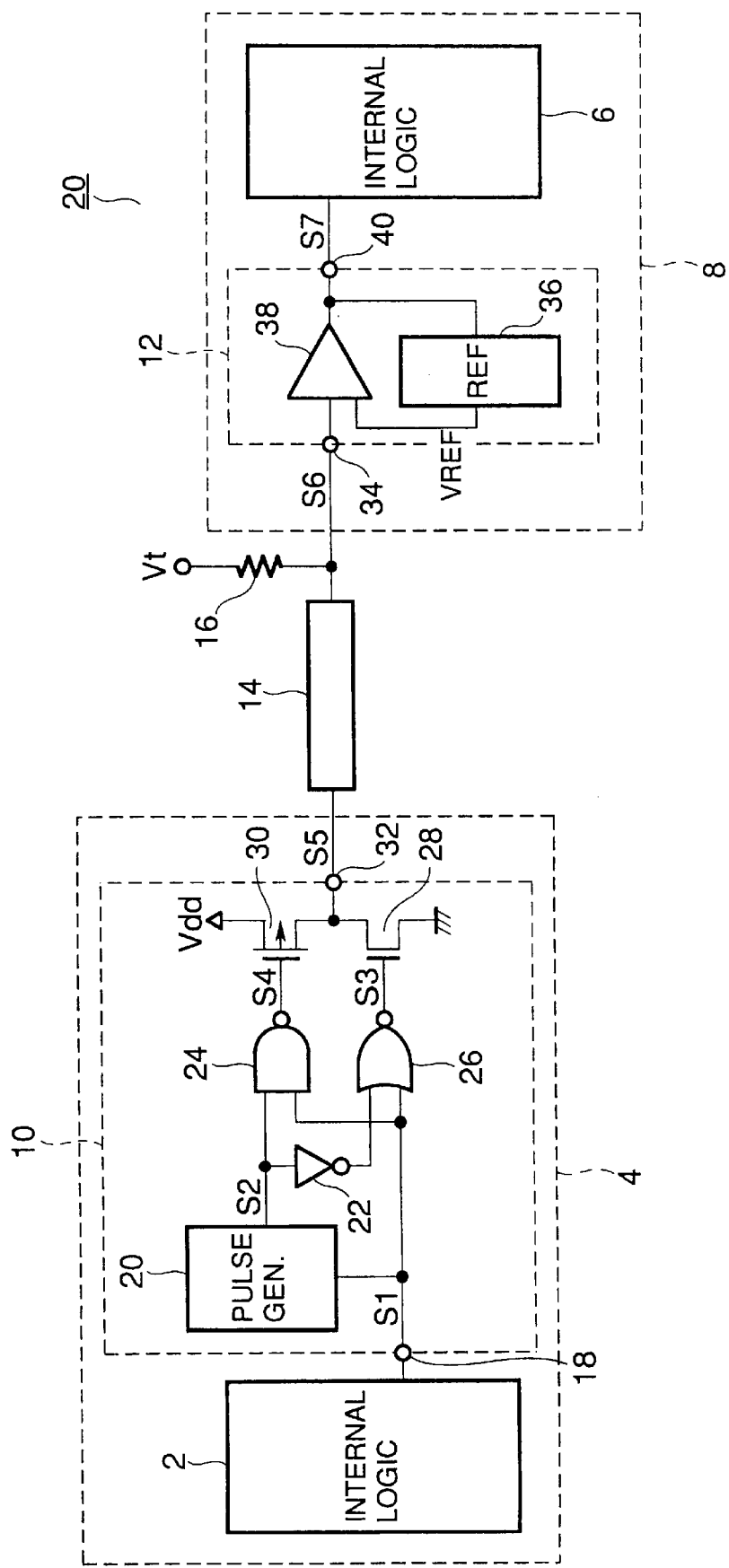
FIG. 1 is a schematic diagram of an interface circuit showing a first embodiment of the invention.

Referring to FIG. 1, the first embodiment is an interface circuit that transmits a binary logic signal S1 from a first logic circuit 2 in a first IC 4 to a second logic circuit 6 in a second IC 8. The interface comprises a driver circuit 10 disposed in the first IC 4, a receiver circuit 12 disposed in the second IC 8, a transmission line 14 interconnecting the transmitting and receiver circuits 10 and 12, and a termination resistor 16 by which the transmission line 14 is coupled, at a point near the second IC 8, to a termination potential Vt.

Vt must be intermediate between the supply voltage Vdd and ground (0 V). It will be assumed below that Vt is 1.5 V, although the first embodiment is not limited to this particular termination potential.

The transmission line 14 is, for example, a microstrip line comprising a printed wiring trace disposed in one layer of a multiple-layer printed-circuit board, facing a ground plane disposed in another layer. The termination resistor 16 has a resistance equal to the characteristic impedance of the transmission line 14. It will be assumed below that the termination resistor 16 has a resistance of fifty ohms (50 Ω).

The driver circuit 10 comprises an input terminal 18, a pulse generator 20, a CMOS inverter 22, a CMOS NAND gate 24, a CMOS NOR gate 26, an n-channel metal-oxide-semiconductor field-effect transistor (hereinafter, NMOS transistor) 28, a p-channel metal-oxide-semiconductor Field-effect transistor (hereinafter, PMOS transistor) 30, and an output terminal 32.

The input terminal 18 receives the binary logic signal S1 from the first logic circuit 2, and supplies this signal S1 to the pulse generator 20, NAND gate 24, and NOR gate 26. This signal S1 has CMOS logic levels equal to the power-supply and ground levels of the first IC 4: logic high is 3.3 V, and logic low is 0 V.

The pulse generator 20 supplies a three-state control signal S2 to the inverter 22 and NAND gate 24. The output of the inverter 22 is supplied to the NOR gate 26. The output S3 of NOR gate 26 is coupled to the gate electrode (hereinafter, gate) of NMOS transistor 28. The output S4 of NAND gate 24 is supplied to the gate of PMOS transistor 30.

The source electrode (hereinafter, source) of NMOS transistor 28 is coupled to ground, and its drain electrode (hereinafter, drain) is coupled to the output terminal 32. The source of PMOS transistor 30 is coupled to the power-supply potential Vdd, and its drain is coupled to the output terminal 32. The NMOS transistor 28 and PMOS transistor 30 thus act as driving elements for the output terminal 32, which is coupled to the transmission line 14. The signal transmitted from the output terminal 32 is denoted S5. The resistance of NMOS transistor 28 in the on-state (hereinafter, its on-resistance) is 100 Ω. The on-resistance of PMOS transistor 30 is 130 Ω.

The internal structure of the pulse generator 20 will be described later.

The receiver circuit 12 comprises an input terminal 34, a reference-potential control circuit 36, a differential amplifier 38, and an output terminal 40. The input terminal 34 is coupled to the transmission line 14, and supplies the signal S6 received from the transmission line 14 to one input of the differential amplifier 38. The reference-potential control circuit 36 is coupled to the output terminal 40, and supplies a reference potential VREF to the other input of the differential amplifier 38. The signal S7 output by the differential amplifier 38 is supplied to the reference-potential control circuit 36 and output terminal 40, and from the output terminal 40 to the second logic circuit 6.

The internal structure of the reference-potential control circuit 36 and differential amplifier 38 will be described later.

Figure 2:
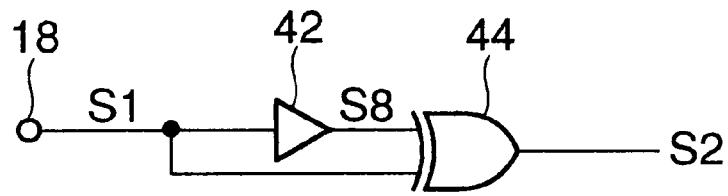
FIG. 2 illustrates the configuration of the pulse generator in the first embodiment.

Referring to FIG. 2, the pulse generator 20 in the driver circuit 10 comprises a delay element 42 and an exclusive-OR gate 44. The delay element 42 receives the binary logic signal S1 from the input terminal 18. The exclusive-OR gate 44 receives both this binary logic signal S1 and the output signal S8 of the delay element 42, takes the logical exclusive OR of these two signals S1 and S8, and thereby produces the three-state control signal S2.

The delay element 42 comprises, for example, two CMOS inverters coupled in series. If two CMOS inverters do not produce a sufficient delay, any even number of CMOS inverters coupled in series can be employed as the delay element 42.

Figure 3:
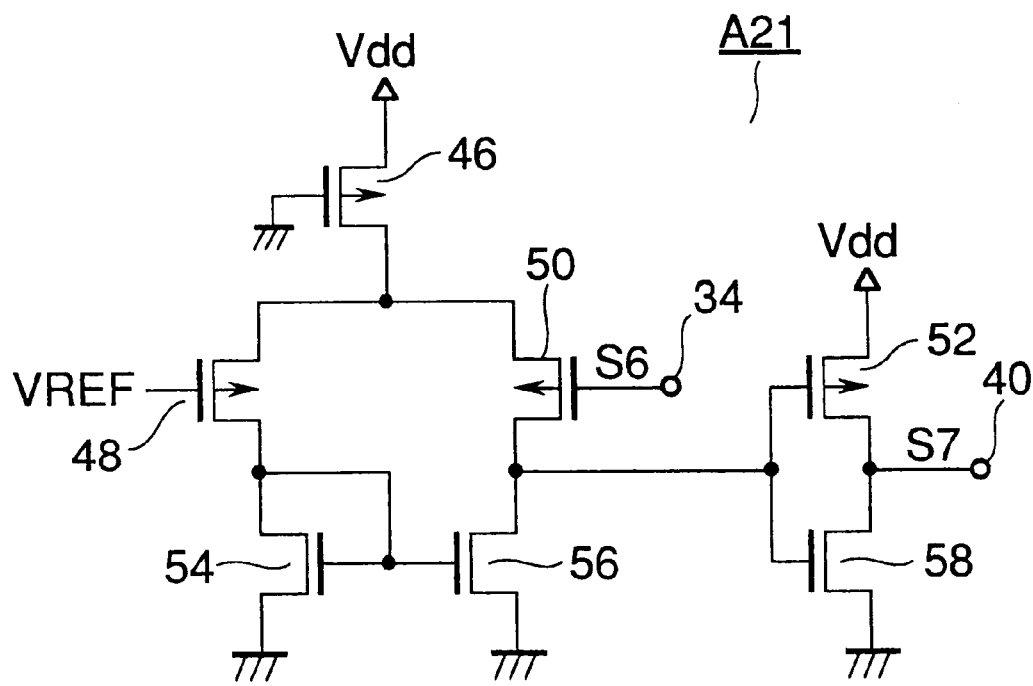
FIG. 3 illustrates the configuration of the differential amplifier in the first embodiment.

Referring to FIG. 3, the differential amplifier 38 in the receiver circuit 12 comprises PMOS transistors 46, 48, 50, and 52, and NMOS transistors 54, 56, and 58, which are interconnected as shown. The reference potential VREF is supplied to the gate of PMOS transistor 48. The received signal S6 is supplied from input terminal 34 to the gate of PMOS transistor 50. The drains of PMOS transistor 52 and NMOS transistor 58 are coupled to the output terminal 40 at which the output signal S7 is output.

PMOS transistors 46, 48, and 50 and NMOS transistors 54 and 56 are coupled in a well-known configuration to form a differential voltage amplifying stage. The drain potential of PMOS transistor 50 falls toward the ground level as the input signal S6 rises above VREF, and rises toward Vdd as S6 falls below VREF.

The sources of PMOS transistor 52 and NMOS transistor 58 are coupled to Vdd and ground, respectively, and their gates are coupled to the drain of PMOS transistor 50. PMOS transistor 52 and NMOS transistor 58 form an inverting output stage, driving the output signal S7 to the high (Vdd) level when S6 is above VREF, and to the Low (ground) level when S6 is below VREF. The differential amplifier 38 thus functions as a comparator.

The invention is not limited to the differential amplifier circuit shown in FIG. 3. Various other well-known circuit configurations are possible.

Figure 4:
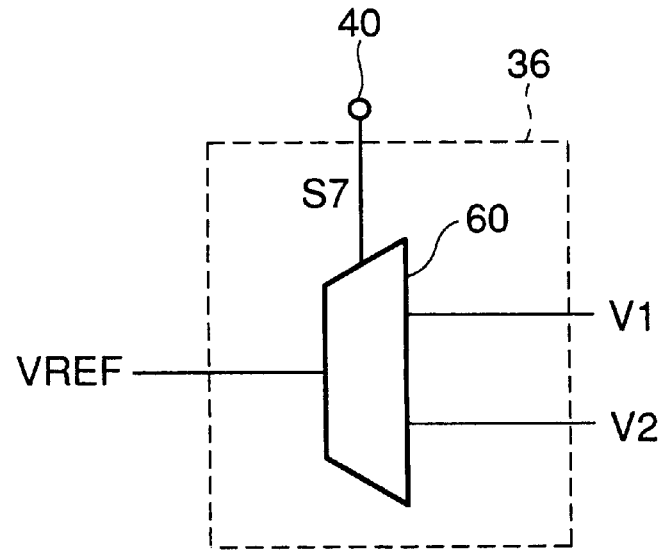
FIG. 4 illustrates the configuration of the reference-potential control circuit in the first embodiment.

Referring to FIG. 4, the reference-potential control circuit 36 comprises a selector circuit 60 that receives the signal S7 output at output terminal 40 and two different reference potentials V1 and V2, selects either V1 or V2 according to the logic level of S7, and outputs the selected potential as the reference potential VREF. In the description below, V1 will be 1.4 V and V2 will be 1.6 V, although the first embodiment is not limited to these particular values.

Figure 5:
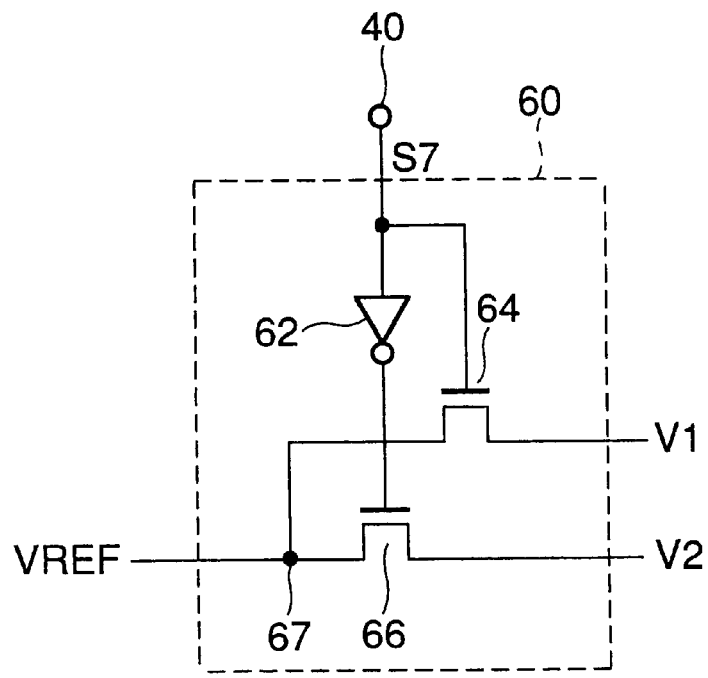
FIG. 5 illustrates the configuration of the selector circuit in the above reference-potential control circuit.

Referring to FIG. 5, the selector circuit 60 comprises a CMOS inverter 62 and a pair of NMOS transistors 64 and 66. The output terminal 40 of the receiver circuit is coupled directly to the gate of NMOS transistor 64, and is coupled through the inverter 62 to the gate of NMOS transistor 66. The source of NMOS transistor 64 receives reference potential V1, the source of NMOS transistor 66 receives reference potential V2, and the drains of both NMOS transistors 64 and 66 are coupled to a node 67 from which the reference potential VREF is output.

Next, the operation of the first embodiment will be described. The operation of the driver circuit 10 and receiver circuit 12 will be described separately. The terms "high" and "low" in the description refer to the Vdd level (3.3 V) and ground level (0 V), respectively.

Figure 6:
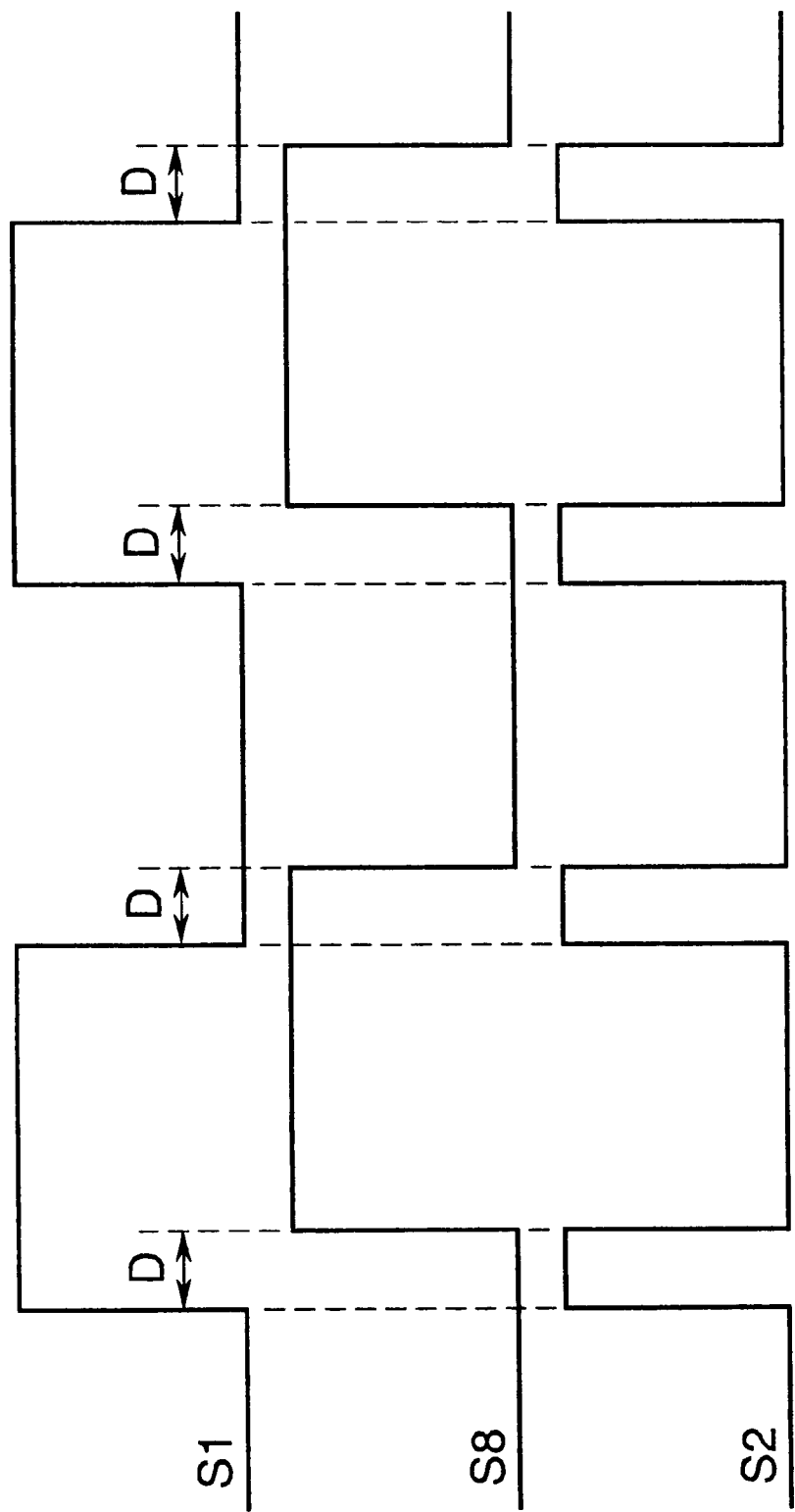
FIG. 6 is a timing diagram illustrating the operation of the pulse generator in the first embodiment.

First, the operation of the pulse generator 20 will be described. FIG. 6 illustrates this operation when the binary logic signal S1 input from the first logic circuit 2 is a square wave.

The output S8 of the delay element 42 in the pulse generator 20 is identical to the input signal S1 with a slight delay D. This delay D must be less than the minimum interval between transitions of the input signal S1. Preferably, the delay D does not exceed half the minimum interval between transitions of S1.

The output S2 of the exclusive-OR gate 44 is low when the two inputs SI and S8 of exclusive-OR gate 44 are the same, and is high when these two inputs S1 and S8 differ. The output S2 is accordingly high only for the intervals of length D following each transition of the input signal Si, and is low at other times. The three-state control signal S2 is thus a pulse signal comprising one comparatively brief high pulse following each transition of S1.

Figure 7:
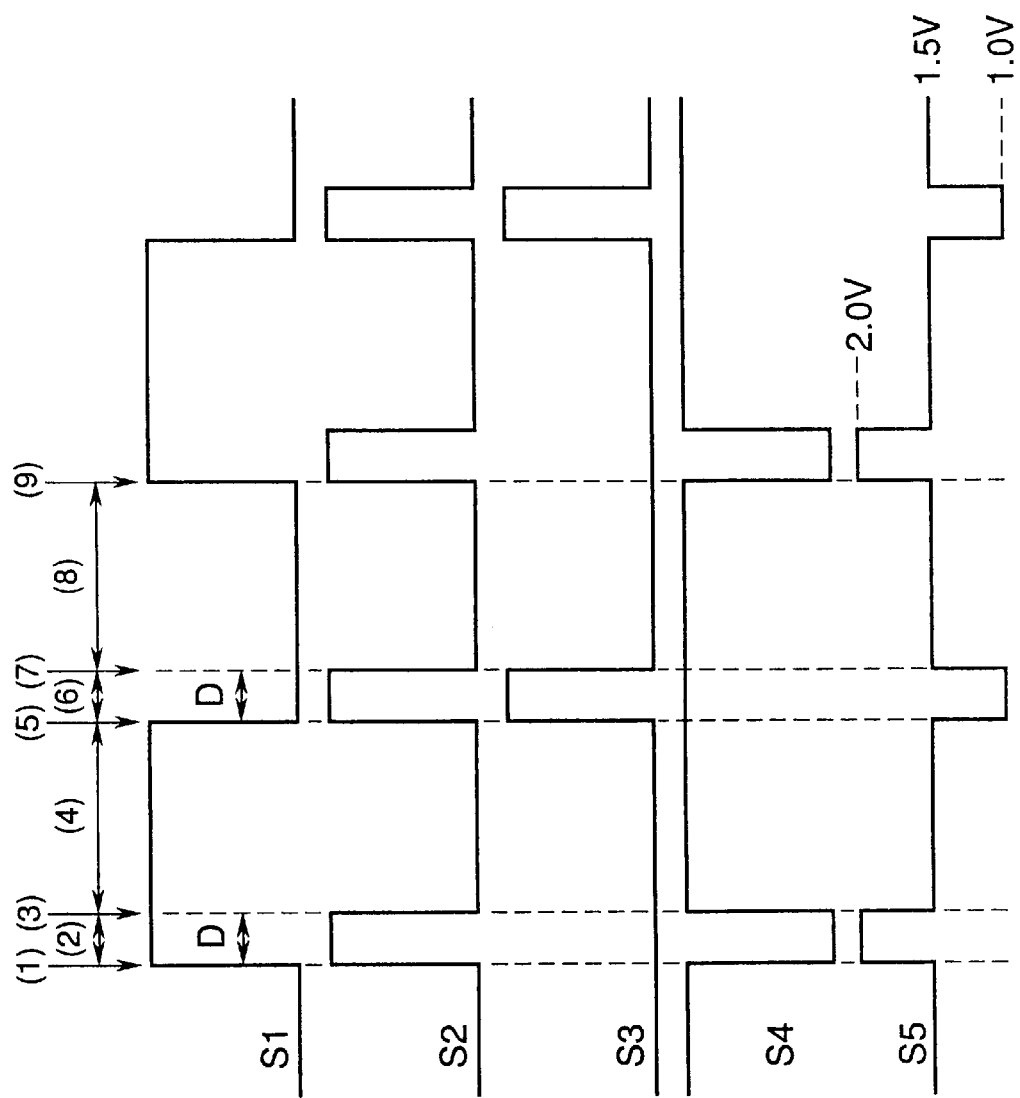
FIG. 7 is a timing diagram illustrating the operation of the driver circuit in the first embodiment.

Next the operation of the driver circuit 10 will be described with reference to FIG. 7, which shows waveforms of the input signal S1 received from the first logic circuit 2, the three-state control signal S2, the output S3 of NOR gate 26, the output S4 of NAND gate 24, and the transmitted signal S5. The input signal S1 is again shown as a square wave. The numbers (1) to (9) in parentheses indicate associated timings.

Initially, the input signal S1 and three-state control signal S2 are both low. The NOR gate 26 receives one low input (S1) and one high input (S2 inverted by inverter 22), so the output S3 of NOR gate 26 is initially low and NMOS transistor 28 is initially turned off. The NAND gate 24 receives two low inputs (S1 and S2), so its output S4 is initially high and PMOS transistor 30 is also initially turned off. The output terminal 32 is therefore initially in the high-impedance state, and the transmitted signal S5 is initially held at the termination potential Vt (1.5 V).

When the input signal S1 goes high at timing (1), the three-state control signal S2 goes high for an interval of length D as described above. During this interval (2), NOR gate 26 receives one high input (S1), so the output S3 of NOR gate 26 remains low. NAND gate 24 receives two high inputs (S1 and S2), so the output S4 of NAND gate 24 goes low, turning on PMOS transistor 30.

PMOS transistor 30 and the termination resistor 16 now form a voltage divider between the power-supply potential Vdd and termination potential Vt, placing the output terminal 32 at a potential. intermediate between Vdd and Vt. From the on-resistance of PMOS transistor 30 (130 Ω), the resistance value of resistor 16 (50 Ω), and the values of Vdd (3.3 V) and Vt (1.5 V), it can be calculated that the output terminal 32 is placed at a potential of 2.0 V, as shown in the waveform of the transmitted signal S5.

When the three-state control signal S2 goes low at timing (3), NAND gate 24 receives one low input (S2), so the output S4 of NAND gate 24 reverts to the high Level, turning off PMOS transistor 30. NOR gate 26 continues to receive a high input (S1), so its output S3 remains low and NMOS transistor 28 remains in the off-state. The output terminal 32 thus returns to the high-impedance state, and the transmitted signal S5 is brought back to the termination potential Vt of 1.5 V. This state is maintained during the ensuing interval (4).

When the input signal S1 goes low at timing (5), the three-state control signal S2 again goes high for an interval of length D. During this interval (6), NOR gate 26 receives two low inputs (S1 and the output of inverter 22, which inverts S2), so the output S3 of NOR gate 26 goes high, turning on NMOS transistor 28. NAND gate 24 receives one low input (S1), so the output S4 of NAND gate 24 remains high, and PMOS transistor 30 remains in the off-state.

Now NMOS transistor 28 and the termination resistor 16 form a voltage divider between the termination potential Vt and ground, placing the output terminal 32 at a potential intermediate between Vt and ground. From the on-resistance of NMOS transistor 28 (100 Ω), the resistance value of resistor 16 (50 Ω), and the values of Vt (1.5 V) and ground (0 V), it can be calculated that the output terminal 32 is placed at a potential of 1.0 V, as shown in the waveform of the transmitted signal S5.

When the three-state control signal S2 goes low at timing (7), NOR gate 26 receives one high input (the output of inverter 22), so the output S3 of NOR gate 26 reverts to the low level, turning off NMOS transistor 28. PMOS transistor 30 remains in the off-state, so the output terminal 32 again returns to the high-impedance state, and the transmitted signal S5 is brought once more to the termination potential Vt of 1.5 V. This state is maintained during the ensuing interval (8), until the input signal S1 goes high again at timing (9) arid the above operations are repeated.

To summarize the operation of the driver circuit 10, each rising transition of the input logic signal S1 produces a positive-going pulse in the transmitted signal S5, which rises to a potential higher than Vt but lower than Vdd. Each falling transition of the input logic signal S1 produces a negative-going pulse in the transmitted signal S5, which falls to a potential higher than ground but lower than Vt. The pulse width D of these pulses in the transmitted signal S5 is less than the interval between transitions of S1.

Figure 8:
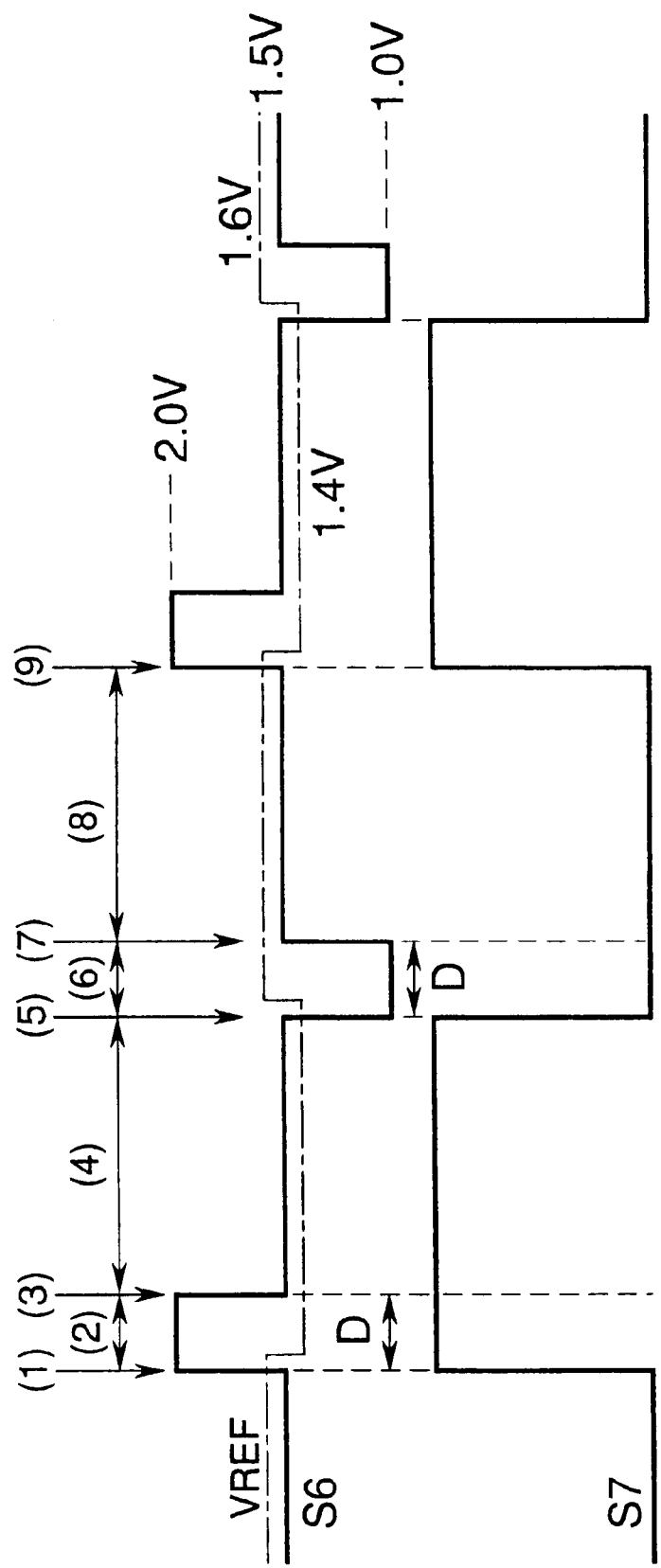
FIG. 8 is a timing diagram illustrating the operation of the receiver circuit in the first embodiment.

Next, the operation of the receiver circuit 12 will be described with reference to FIG. 8, which shows timing waveforms of the reference voltage VREF, the received signal S6, and the output signal S7. Timings are again indicated by numbers (1) to (9) in parentheses.

Initially, the received signal S6 is at the termination potential Vt of 1.5 V. In the drawing, the output signal S7 is initially low and the reference voltage VREF is 1.6 V. This state is stable: the low level of the output signal S7 causes the selector circuit 60 in the reference-potential control circuit 36 to select V2 (1.6 V) for output as VREF, and since the S6 potential (1.5 V) is below VREF, the differential amplifier 38 holds the output signal S7 at the low level.

When the received signal S6 rises from 1.5 V to 2.0 V at timing (1), it passes through the reference potential VREF (1.6 V) supplied to the differential amplifier 38. When the S6 potential becomes higher than the VREF potential, the output S7 of the differential amplifier 38 changes from the low level to the high level, as shown. There is actually a slight delay between the rise of S6 and the rise of S7, but this has been omitted to simplify the drawing.

During the interval (2) while the received signal S6 remains at 2.0 V, the output signal S7 remains high, and the high level of S7 causes the selector circuit 60 in the reference-potential control circuit 36 to select V1 (1.4 V) for output as the reference potential VREF. As indicated, there is a slight delay between the rise of S7 and the fall of VREF. The total delay from the rise of the received signal S6 to the fall of VREF must be less than the pulse width D.

When the received signal S6 returns to the termination potential of 1.5 V at timing (3), it does not pass through the VREF potential, because VREF is now lower than 1.5 V. The output S7 of the differential amplifier 38 therefore remains high. This state, with S7 high and VREF equal to 1.4 V, is maintained during the ensuing interval (4), for as long as the received signal S6 stays at 1.5 V.

When the received signal S6 falls to 1.0 V at timing (5), it passes through the reference potential VREF (1.4 V) now supplied to the differential amplifier 38. When the S6 potential becomes lower than the VREF potential, the output S7 of the differential amplifier 38 changes from the high level to the low level, as shown. The slight delay from the fall of S6 to the fall of S7 has again been omitted to simplify the drawing.

During the interval (6) while the received signal S6 remains at 1.0 V, the output signal S7 remains low, and the low level of S7 causes the selector circuit 60 in the reference-potential control circuit 36 to select V2 (1.6 V) once again for output as the reference potential VREF. There is a slight delay from the fall of S7 to the rise of VREF. The total delay from the fall of the received signal S6 to the rise of VREF must be less than the pulse width D.

When the received signal S6 returns to the termination potential of 1.5 V at timing (7), it does not pass through the VREF potential, because VREF is now higher than 1.5 V. The output S7 of the differential amplifier 38 therefore remains low. This state, with S7 low and VREF equal to 1.6 V, is maintained during the ensuing interval (8), until the received signal S6 rises again at timing (9) and the above operation is repeated.

To summarize the operation of the receiver circuit 12, when the received signal S6 rises from the termination potential of 1.5 V to the 2.0-V positive-going pulse level, the output signal S7 goes high, and remains high even after S6 returns to the termination potential. When the received signal S6 falls from the termination potential 1.5 V to the 1.0-V negative-going pulse level, the output signal S7 goes low, and remains low even after S6 returns to the termination potential. Positive-going and negative-going pulses normally occur alternately, so each positive-going S6 pulse produces one rising transition of the output signal S7, each negative-going S6 pulse produces one falling transition of the output signal S7.

This operation is carried out by switching dynamically between two reference potentials VREF (V1 and V2). Two reference potentials are necessary, because the receiver circuit 12 receives three signal levels (2.0 V, 1.5 V, and 1.0 V).

Figure 9:
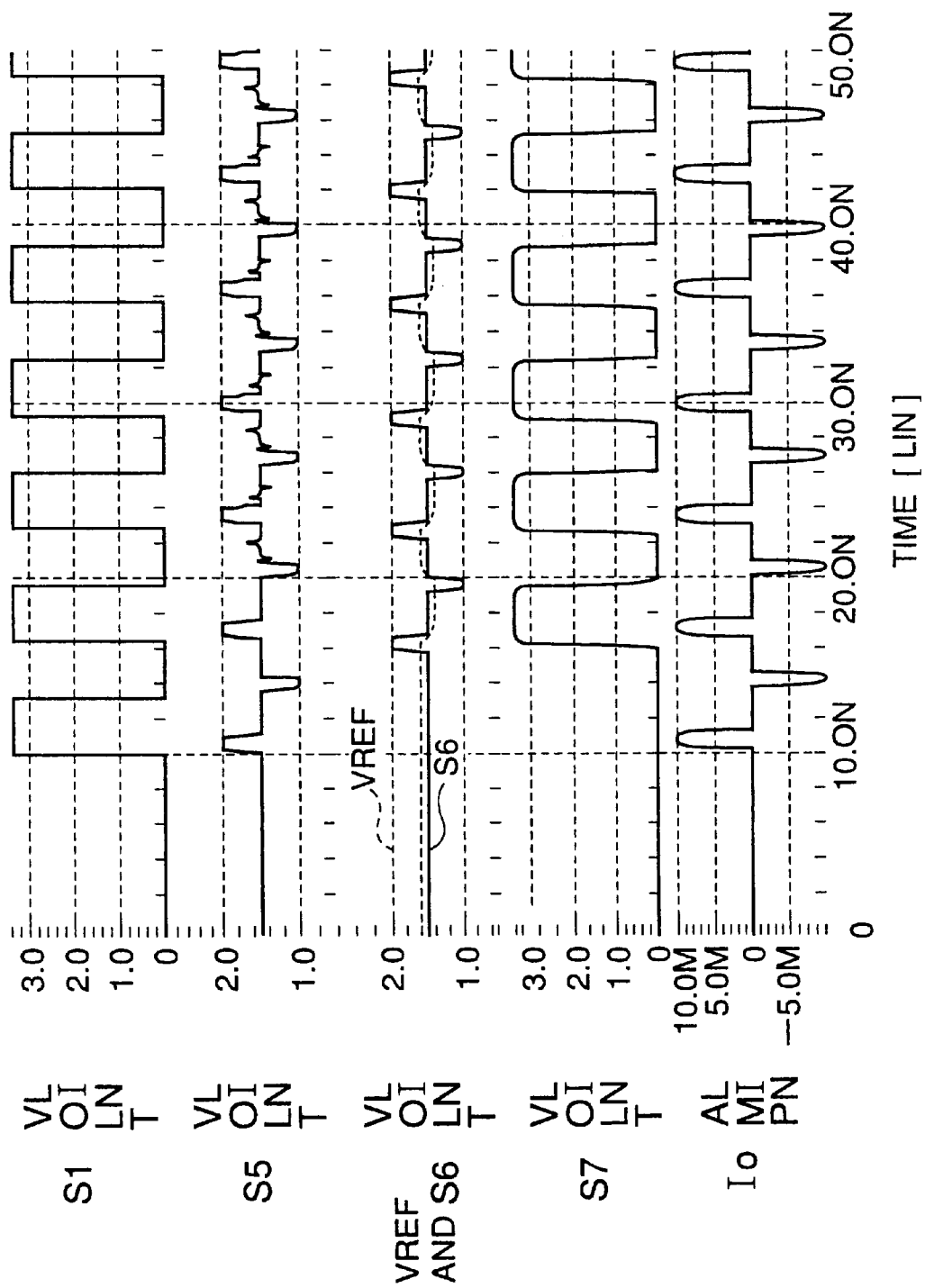
FIG. 9 is a timing diagram showing simulation results for the first embodiment.

FIG. 9 shows the result of a computer simulation of the operation of the first embodiment. The transmission line 14 is assumed to have a length of 0.8 meters and a propagation delay of 6.7 nanoseconds per meter. The delay element 42 in the pulse generator 20 is assumed to provide a delay of approximately 0.8 nanoseconds. The input binary logic signal S1 is assumed to be a square wave with a frequency of 156 MHz.

The horizontal axis in FIG. 9 indicates time in nanoseconds (N). The vertical scale indicates the levels of the input logic signal S1, transmitted signal S5, received signal S6, reference potential VREF, and output signal S7 in volts, and indicates the current flow through the output terminal 32 of the driver circuit 10 in milliamperes. All scales are linear (LIN).

Each low-to-high or high-to-low transition of the input logic signal S1 generates an immediate pulse in the transmitted signal S5 at the output terminal 32 of the driver circuit 10. Slightly less than six nanoseconds later, after propagation through the transmission line 14, a corresponding pulse appears in the received signal S6 at the input terminal 34 of the receiver circuit 12. Each received pulse changes the logic level of the output signal S7. The waveform of the signal S7 output from the receiver circuit 12 is substantially identical to the waveform of the logic signal S1 input to the driver circuit S1, with a six-nanosecond delay. The interface circuit is thus seen to transmit logic signals from the first logic circuit 2 in the first IC 4 to the second logic circuit 6 in the second IC 8.

The current Io drawn at the output terminal 32 of the driver circuit 10 is limited to brief ten-milliampere pulses coinciding with the pulses of the transmitted signal S5. Power dissipation in the driver circuit 10 can be calculated from the equation $P=I^2R$, in which P is power, I is current, and R is resistance. During a positive-going pulse, the driver circuit 10 briefly dissipates thirteen milliwatts, as a ten-milliampere current flows through the 130-$\Omega$ on-resistance of PMOS transistor 30. During a negative-going pulse, the driver circuit 10 briefly dissipates ten milliwatts, as the same current flows through the 100-$\Omega$ on-resistance of NMOS transistor 28. Substantially no power is dissipated in the driver circuit 10 at other times.

Similarly, current flow through the 50-$\Omega$ termination resistor 16 is limited to the duration of the positive- and negative-going pulses in the received signal S6, since at other times both ends of the termination resistor 16 are at the termination potential Vt. During these received signal pulses, five milliwatts are dissipated in the termination resistor 16. At other times, no power is dissipated in the termination resistor 16.

A conventional interface circuit operating at the same power-supply potential of 3.3 V, with the same output potentials of 1.0 V and 2.0 V, the same termination potential of 1.5 V, and the same termination resistance of 50 $\Omega$, would draw ten milliamperes of current at all times, dissipating a steady five milliwatts of power in the termination resistor and a steady ten milliwatts or more in the driver circuit itself.

In the first embodiment, average current consumption and power dissipation are reduced to a fraction of the conventional values, because current flows for only a fraction of the conventional time. The size of the fraction depends on the pulse width D and the frequency with which the input logic signal S1 changes between the high and low logic levels, but if D does not exceed half the minimum interval between transitions of S1, current consumption and power dissipation are cut at least in half by the first embodiment, even if the input logic signal S1 switches levels at the maximum rate.

In the receiver circuit 12, a small amount of DC power is dissipated in the differential amplifier 38, but this is also true of conventional low-voltage-swing interface circuits. No DC power is dissipated in the reference-potential control circuit 36 in the first embodiment.

The pulse waveforms in the first embodiment are transmitted from the first IC 4 to the second IC 8 with Little distortion, because the termination resistor 16 is matched to the characteristic impedance of the transmission line 14, and signal reflections are absorbed in the termination. The small voltage swing on the transmission line 14, between 1.0 V and 2.0 V instead of between 0 V and 3.3 V, reduces interference with signals on other transmission lines. The first embodiment accordingly provides the same advantages as the CTT interface and other low-voltage-swing interface circuits that use terminated transmission lines to transmit high-speed signals, with the further advantages of greatly reduced current consumption and greatly reduced power dissipation.

The additional requirements of the first embodiment, as compared with conventional low-voltage-swing interface circuits, are the pulse generator 20 in the driver circuit 10 and the reference-potential control circuit 36 in the receiver circuit 12. As can be seen in FIGS. 2 and 4, both the pulse generator 20 and the reference-potential control circuit 36 have simple configurations, so these circuits do not add significantly to the size or cost of ICs 4 and 8.

Conventional interfaces often have three-state control circuits that can place the output terminal of the driver circuit in the high-impedance state, so that this same terminal can also be used to receive signals from the transmission line. These conventional three-state control circuits enable the same terminal to be used as either an input port or an output port.

Differing from the first embodiment, however, these conventional three-state control circuits do not place the output terminal in the high-impedance state during output-port operation. Moreover, to place the output terminal in the high-impedance state for input-port operation, these conventional circuits require a separate control signal. The first embodiment places the output terminal 32 in the high-impedance state automatically.

Next, a second embodiment will be described.

The transmitting and receiver circuits in the second embodiment have the same configurations as in the first embodiment. Their circuit elements will be identified by the same reference numerals as in the first embodiment.

Figure 10:
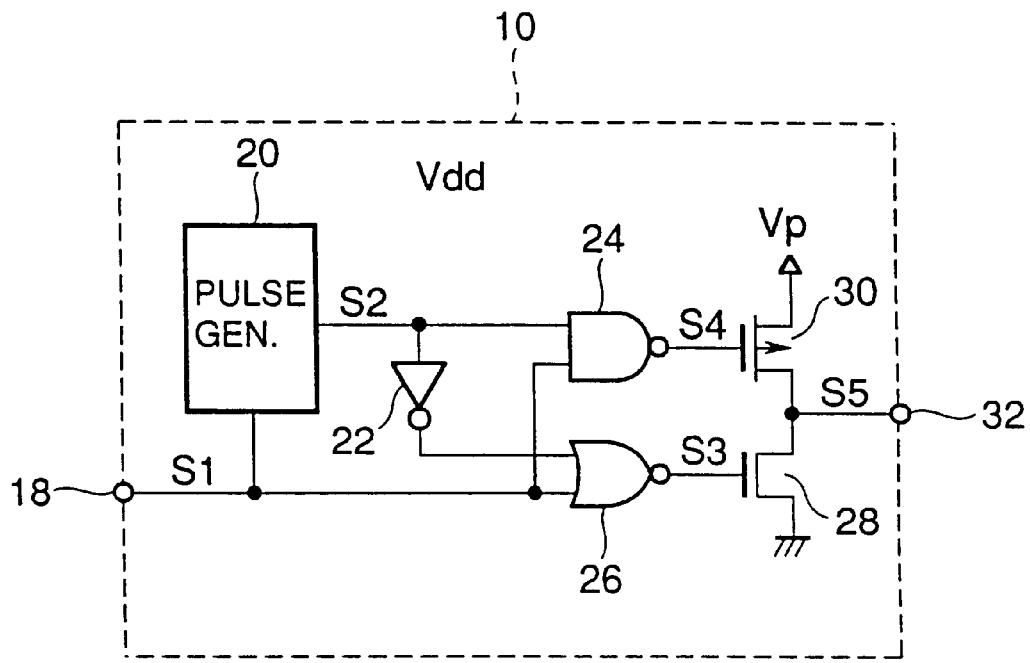
FIG. 10 is a schematic diagram of the driver circuit in a second embodiment of the invention.

Referring to FIG. 10, the second embodiment differs from the first embodiment in that an auxiliary power-supply potential Vp is supplied to the source of PMOS transistor 30 in the driver circuit 10. Vp is lower than the power-supply potential Vdd supplied to other parts of the driver circuit 10, and to other circuits in the first IC 4. Vp can be generated by any convenient means, such as a power-supply circuit external to the first IC 4. In the following description it will be assumed that Vdd is 3.3 V and Vp is 2.0 V.

The termination potential Vt, the on-resistances of NMOS resistor 28 and PMOS resistor 30 in the driver circuit 10, and the reference potentials V1 and V2 supplied to the reference-potential control circuit 36 in the receiver circuit 12 are also lower than in the first embodiment. In the following description the termination potential Vt is 1.0 V, the on-resistance value of NMOS transistor 28 is 50 Ω, the on-resistance value of PMOS transistor 30 is 50 Ω, V1 is 0.9 V, and V2 is 1.1 V.

The characteristic impedance of the transmission line 14 is 50 Ω, and the termination resistance is also 50 Ω, as in the first embodiment.

The second embodiment operates in the same way as the first embodiment, so a detailed description will be omitted, except to point out that positive-going pulses of the transmitted signal S5 rise from the termination potential of 1.0 V to a potential of 1.5 V, and negative-going pulses of S5 fall from the termination potential of 1.0 V to a potential of 0.5 V. These values can be calculated from the termination resistance value and the on-resistances of NMOS transistor 28 and PMOS transistor 30, all of which are 50 Ω as noted above.

The second embodiment accordingly has the same one-volt voltage swing as the first embodiment, but the swing is between 0.5 V and 1.5 V, instead of 1.0 V and 2.0 V.

The second embodiment dissipates even less power than the first embodiment. Power dissipation in the termination resistor 16 is the same, because the signal swing on the transmission line is the same. Power dissipation in the driver circuit 10 is reduced, however, because the on-resistances of NMOS transistor 28 and PMOS transistor 30 have been reduced. Specifically, during the transmission of a positive-going pulse, five milliwatts are dissipated in PMOS transistor 30, instead of the thirteen milliwatts of the first embodiment. During the transmission of a negative-going pulse, five milliwatts are dissipated in NMOS transistor 28, instead of the ten milliwatts of the first embodiment.

The second embodiment thus provides the same advantages as the first embodiment, with the further advantage of less power dissipation in the driver circuit 10. This further power saving is achieved without loss of operating speed, because the reduced power-supply potential Vp is supplied only to the source of PMOS transistor 30. The other circuit elements in the driver circuit 10 operate at the normal power-supply potential (Vdd).

Next, a third embodiment will be described.

Figure 11:
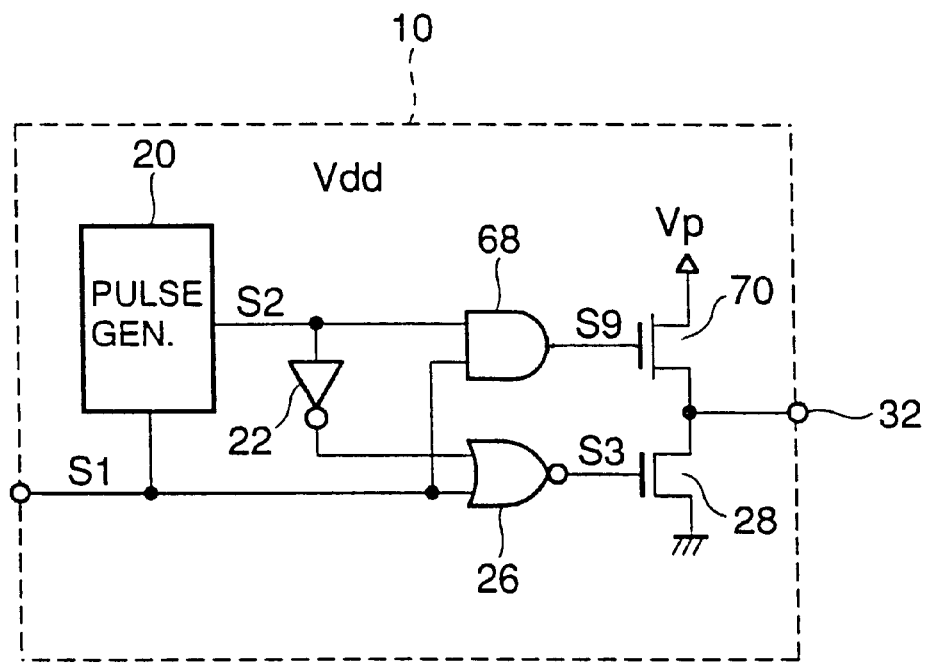
FIG. 11 is a schematic diagram of the driver circuit in a third embodiment of the invention.

Referring to FIG. 11, the driver circuit 10 in the third embodiment has the same configuration as in the second embodiment, except that the NAND gate 24 of the second embodiment is replaced by an AND gate 68, and PMOS transistor 30 is replaced by an NMOS transistor 70. The output signal S9 of AND gate 68 is supplied to the gate of NMOS transistor 70. The source of NMOS transistor 70 is coupled to the output terminal 32. The drain of NMOS transistor 70 receives the auxiliary power-supply potential Vp described in the second embodiment.

The receiver circuit 12, transmission line 14, termination resistor 16, and termination potential Vt in the third embodiment are the same as in the second embodiment. The termination resistance, the on-resistance of NMOS transistor 28, and the on-resistance of NMOS transistor 70 are all 50 Ω.

The operation of the third embodiment differs from the operation of the second embodiment only in the manner in which a positive-going pulse is transmitted. When the input logic signal Si goes high, for the interval of duration D during which signals S1 and S2 are both high, the output of AND gate 68 goes high, turning on NMOS transistor 70. The potential at the output terminal 32 then rises from the termination potential of 1.0 V to a potential of 1.5 V. When the three-state control signal S2 goes low at the end of the interval of duration D, the output of AND gate 68 also goes low, turning off NMOS transistor 70, and the output terminal 32 returns to the termination potential of 1.0 V.

The third embodiment provides the same advantages as the second embodiment, with the additional advantage of smaller driver circuit size and improved immunity to latch-up.

The driver circuit 10 in the third embodiment is smaller, because NMOS transistors have a greater carrier mobility than PMOS transistors, and a lower threshold voltage. For the same on-resistance value, the NMOS transistor 70 of the third embodiment can therefore have a smaller gate width than a PMOS transistor 30 of the second embodiment.

Latch-up immunity is improved for the following reason. When taken together, the NMOS transistor 28 and PMOS transistor 30 in the first and second embodiments form a pnpn structure. Under unfavorable circumstances, such as an abnormal transient voltage applied to the transmission line 14, this structure can act as a thyristor and latch up in the on-state, allowing a high current to flow for an extended period of time. Undesirable consequences can include the burning open of aluminum interconnecting lines, destruction of pn junctions, and other fatal damage to the first IC 4.

The two NMOS transistors 28 and 70 that drive the transmission line 14 in the third embodiment do not form a pnpn structure and cannot act as a thyristor, so latch-up is effectively prevented.

Next, a fourth embodiment will be described.

The fourth embodiment has the same driver circuit 10 as the first embodiment, but differs in the structure of the reference-potential control circuit 36 in the receiver circuit 12.

Figure 12:
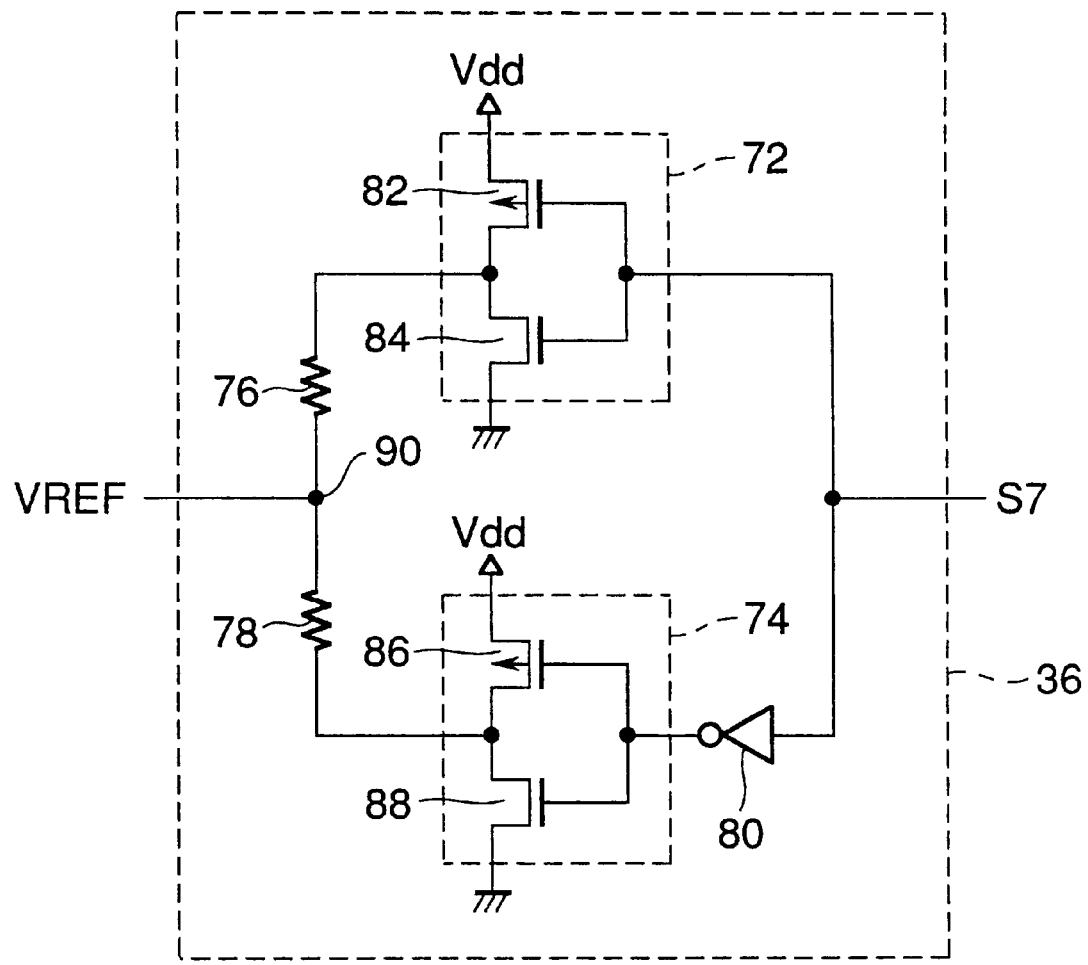
FIG. 12 is a schematic diagram of the reference-potential control circuit in a fourth embodiment of the invention.

Referring to FIG. 12, the reference-potential control circuit 36 in the fourth embodiment comprises two gate circuits 72 and 74, two resistors 76 and 78, and a CMOS inverter 80. The first gate circuit 72 comprises a first PMOS transistor 82 and a first NMOS transistor 84, which are coupled in series between the power-supply potential Vdd and ground. The second gate circuit 74 comprises a second PMOS transistor 86 and a second NMOS transistor 88, which are also coupled in series between Vdd and ground.

The output signal S7 or the receiver circuit 12 is supplied to the gates of the first PMOS and NMOS transistors 82 and 84, and to the inverter 80. The output of the inverter 80 is supplied to the gates of the second PMOS and NMOS transistors 86 and 88. The drains of the first PMOS and NMOS transistors 82 and 84 are both coupled to one terminal of the first resistor 76. The drains of the second PMOS and NMOS transistors 86 and 88 are both coupled to one terminal of the second resistor 78. The other terminals of resistors 76 and 78 are both coupled to an output node 90 from which the reference voltage VREF is supplied to the differential amplifier 38.

The operation of the reference-potential control circuit 36 in FIG. 12 will be described under the assumption that the power-supply potential Vdd is 3.3 V, the resistance values of the first resistor 76 and second resistor 78 are both 500 Ω, the on-resistance of the first PMOS transistor 82 is 350 Ω, the on-resistance of the first NMOS transistor 84 is 200 Ω, the on-resistance of the second PMOS transistor 86 is 450 Ω, and the on-resistance of the second NMOS transistor 88 is 300 Ω.

When the output signal S7 of the receiver circuit 12 is high, the first PMOS transistor 82 is in the off-state, the first NMOS transistor 84 is in the on-state, the second PMOS transistor 86 is in the on-state, the second NMOS transistor 88 is in the off-state, and the output reference potential VREF is determined by the ratios of the on-resistance of the first NMOS transistor 84, the resistance values of resistors 76 and 78, and the on-resistance of the second PMOS transistor 86. The 3.3-V power-supply potential Vdd is divided in the ratio or (450+500):(500+200) or 950:700, and VREF is 1.4 V.

When the output signal S7 of the receiver circuit is low, the first PMOS transistor 82 is in the on-state, the first NMOS transistor 84 is in the off-state, the second PMOS transistor 86 is in the off-state, the second NMOS transistor 88 is in the on-state, and VREF is determined by the ratios of the on-resistance of the first PMOS transistor 82, the resistance values of the resistors 76 and 78, and the on-resistance value of the second NMOS transistor 88. The 3.3-V power-supply potential Vdd is now divided in the ratio of (350+500):(500+300) or 850:800, and VREF is 1.6 V.

The reference-potential control circuit 36 in the fourth embodiment thus performs the same function as the reference-potential control circuit in the first embodiment, outputting a reference potential VREF equal to 1.4 V when S7 is high, and to 1.6 V when S7 is low. The fourth embodiment therefore receives transmitted signals in the manner described in the first embodiment.

The reference-potential control circuit 36 of the fourth embodiment, however, does not require input of reference potentials V1 and V2 as was required in the first embodiment. If V1 and V2 were generated externally in the first embodiment, the fourth embodiment enables the number of input pins of the second IC 8 to be reduced. The design of the printed-circuit board on which this IC 8 is mounted is also simplified, because it is not necessary to provide voltage sources for V1 and V2. Furthermore, the design of IC 8 itself is simplified, as it is not necessary to provide separate paths to bring external potentials V1 and V2 to the reference-potential control circuit 36. These simplifications lead to economic advantages.

In order to produce VREF, the reference-potential control circuit 36 in the fourth embodiment draws DC current, but the current drawn is not large. With the resistance values given above, a current of two milliamperes flows between Vdd and ground in the reference-potential control circuit 36 in the fourth embodiment, dissipating 6.6 milliwatts of power. These current and power values are less than the amount of current and power saved by having the driver circuit 10 transmit short pulses, so the fourth embodiment still consumes less current and dissipates less power than a conventional interface circuit employing similar voltage levels and a similar transmission line.

The voltage values and other values in the embodiments above have been given only as examples. They can be modified to suit varying requirements.

In the first embodiment, for example, the termination potential Vt can be reduced to 1.0 V, while keeping the same one-volt signal swing, by designing PMOS transistor 30 to have an on-resistance of 182 Ω, and NMOS transistor 28 to have an on-resistance of 50 Ω. Positive-going pulses will then rise from 1.0 V to 1.5 V, and negative-going pulses will fall from 1.0 V to 0.5 V, as in the second and third embodiments. The reference potentials in the receiver circuit may be set at any suitable intermediate points in the intervals between 1.5 V, 1.0 V, and 0.5 V. Reference potentials of 1.1 V and 0.9 V can be used, for example, as in the second and third embodiments.

These reference potentials can be produced by the reference-potential control circuit 36 of the fourth embodiment by altering the resistance values of the resistors and transistors shown in FIG. 12. With the same power-supply potential Vdd of 3.3 V, if the resistance values of the resistors 76 and 78 are both 250 Ω, the on-resistance of the first PMOS transistor 82 is 850 Ω, the on-resistance of the first NMOS transistor 84 is 200 Ω, the on-resistance of the second PMOS transistor 86 is 950 Ω, and the on-resistance of the second NMOS transistor 88 is 300 Ω, then the two output reference potentials will be 1.1 V and 0.9 V.

In the second and third embodiments, the signal levels on the transmission line 14 can be modified by changing the auxiliary power-supply potential Vp, as well as by modifying the termination potential Vt and the on-resistance values of NMOS transistor 28 and PMOS transistor 30 or NMOS transistor 70.

The transmission-line potentials of 1.0 V (low), 1.5 V (termination), and 2.0 V (high) given in the first and fourth embodiments comply with the recommendation of the CTT interface standard, but as the above examples show, the invention can be adapted to comply with other small-voltage-swing interface standards.

The invention is not limited to use in CMOS integrated circuits. It can be practiced in integrated circuits of the type that employ CMOS internal logic and bipolar output drivers (so-called Bi-CMOS circuits), in which case the NMOS transistor 28, PMOS transistor 30, and NMOS transistor 70 of the preceding embodiments are replaced by bipolar transistors. The invention can also be practiced in integrated circuits employing purely bipolar logic, such as transistor-transistor logic (TTL) or emitter-coupled logic (ECL). The invention is generally applicable to all types of interface circuits in which the driver circuit has a push-pull configuration.

The invention is not limited to unidirectional transmission of binary logic signals from one IC to another. Bidirectional signal transmission on the same transmission line is also possible, if both a driver circuit and a receiver circuit are provided in each IC. An extra advantage in this case is that while the receiver circuit is operating, the driver circuit in the same IC can be held in the high-impedance state simply by leaving the binary logic signal input to the driver circuit at a constant logic level. No additional control signal is necessary, as the driver circuit generates its own three-state control signal S2.

The invention is not limited to point-to-point transmission of logic signals between two ICs. The invention can also be practiced in point-to-multipoint signal transmission, in which case one transmitting IC and a plurality of receiving ICs are coupled to the same transmission line, or in bus-type signal transmission, in which a plurality of transmitting ICs are coupled to the transmission line.

Nor is the invention limited to signal transmission between different ICs mounted on a single printed-circuit board. The invention can be practiced in the transmission of binary logic signals between any two electronic circuits: for example, between ICs mounted on different printed-circuit boards, between different semiconductor chips in a multi-chip module, or between different parts of a monolithic semiconductor integrated circuit.

The configurations of the driver circuit and receiver circuit are not limited to the configurations described in the embodiments above. The pulse generator, differential amplifier, and reference-potential control circuit are not restricted to the circuit configurations shown in FIGS. 2, 3, 4, and 12. The receiver circuit may have any configuration capable of distinguishing between two different received pulse potentials and maintaining an output logic level from one received pulse to the next.

In the embodiments above, the second internal logic circuit received the same logic levels as output by the first internal logic circuit, but the interface circuit can be adapted so as to invert these logic levels.

Those skilled in the art will recognize that other modifications are possible within the scope claimed below.

What is claimed is:

1. An interface circuit for transmitting a binary logic signal having a first logic level and a second logic level from a first electronic circuit to a second electronic circuit, comprising:

a transmission line having a first terminal at one end and a second terminal at another end, said transmission line being terminated at a termination potential higher than a certain first potential and lower than a certain second potential;

a pulse generator coupled to said first electronic circuit, for outputting a pulse signal having a certain fixed duration immediately following each transition of said binary logic signal from said first logic level to said second logic level, and immediately following each transition of said binary logic signal from said second logic level to said first logic level;

a first driving element coupled to said pulse generator and said first terminal, for driving said first terminal to said first potential when switched on, said first driving element being switched on during output of said pulse signal if said binary logic signal is at said first logic level, and being switched off at other times;

a second driving element coupled to said pulse generator and said first terminal, for driving said first terminal to said second potential when switched on, said second driving element being switched on during output of said pulse signal if said binary logic signal is at said second logic level, and being switched off at other times;

a differential amplifier coupled to said second terminal and said second electronic circuit, for comparing a potential of said second terminal with a reference potential, outputting a third logic level to said second electronic circuit if the potential of said second terminal is lower than said reference potential, and outputting a fourth logic level to said second electronic circuit if the potential of said second terminal is higher than said reference potential; and a reference-potential control circuit coupled to said differential amplifier, for setting said reference potential to a value intermediate between said termination potential and said second potential when said differential amplifier outputs said third logic level, and setting said reference potential to a value intermediate between said termination potential and said first potential when said differential amplifier outputs said fourth logic level.

2. The interface circuit of claim 1, wherein said first electronic circuit, said pulse generator, said first driving element, and said second driving element are disposed in a first integrated circuit.

3. The interface circuit of claim 2, wherein said first integrated circuit operates at a power-supply potential higher than said second potential.

4. The interface circuit of claim 3, wherein said second driving element receives a third potential intermediate between said second potential and said power-supply potential, and drives said first terminal to said second potential by coupling said first terminal to said third potential with a certain on-resistance.

5. The interface circuit of claim 1, wherein said first driving element is an NMOS transistor.

6. The interface circuit of claim 1, wherein said second driving element is a PMOS transistor.

7. The interface circuit of claim 1, wherein said second driving element is an NMOS transistor.

8. The interface circuit of claim 1, wherein said first driving element and said second driving element are bipolar transistors.

9. The interface circuit of claim 1, also comprising a termination resistor having a resistance value matching a characteristic impedance of said transmission line, said transmission line being terminated to said termination potential through said termination resistor.

10. The interface circuit of claim 1, wherein said reference-potential control circuit comprises:

an output node from which said reference potential is supplied to said differential amplifier;

a first gate circuit coupling said output node through a first resistance to a ground potential when said differential amplifier outputs said third logic level, and through a second resistance to a certain positive potential when said differential amplifier outputs said fourth logic level; and a second gate circuit coupling said output node through a third resistance to said ground potential when said differential amplifier outputs said fourth logic level, and through a fourth resistance to said positive potential when said differential amplifier outputs said third logic level.

11. The interface circuit of claim 10, wherein:

said first gate circuit comprises a first PMOS transistor and a first NMOS transistor coupled in series between said positive potential and said ground potential, said first PMOS transistor and said first NMOS transistor being switched on and off responsive to the logic level output by said differential amplifier, and said first PMOS transistor and said first NMOS transistor both having a drain electrode coupled to said output node;

said second gate circuit comprises a second PMOS transistor and a second NMOS transistor coupled in series between said positive potential and said ground potential, said second PMOS transistor and said second NMOS transistor being switched on and off responsive to the logic level output by said differential amplifier, and said second PMOS transistor and said second NMOS transistor both having a drain electrode coupled to said output node.

12. The interface circuit of claim 10, wherein said reference-potential control circuit also comprises:

a first resistor coupled in series between said first gate circuit and said output node; and a second resistor coupled in series between said second gate circuit and said output node.

13. The interface circuit of claim 10, wherein said positive potential is a power-supply potential supplied to said second electronic circuit.

14. The interface circuit of claim 1, wherein said differential amplifier, said reference-potential control circuit, and said second electronic circuit are disposed in a second integrated circuit.

15. The interface circuit of claim 1, wherein said first potential, said second potential, and said termination potential comply with a CMOS low-voltage-swing interface standard.

16. The interface circuit of claim 1, wherein said first potential, said second potential, and said termination potential comply with a center-tap-terminated low-level, high-speed interface standard for digital integrated circuits.

17. The interface circuit of claim 1, wherein said first logic level is equal to said third logic level, and said second logic level is equal to said fourth logic level.

18. The interface circuit of claim 1, wherein said first logic level is equal to said fourth logic level, and said second logic level is equal to said third logic level.

19. A method of transmitting a binary logic signal from a first electronic circuit to a second electronic circuit over a transmission line coupled to said first electronic circuit by a first terminal and to said second electronic circuit by a second terminal, comprising the steps of:

transmitting a pulse at a first potential from said first terminal at each falling transition of said binary logic signal;

transmitting a pulse at a second potential, different from said first potential, from said first terminal at each rising transition of said binary logic signal;

placing said first terminal in a high-impedance state when no transitions occur in said binary logic signal;

outputting a first logic level to said second electronic circuit when a pulse at said first potential is received at said second terminal, output of said first logic level being maintained until a pulse at said second potential is received at said second terminal;

outputting a second logic level to said second electronic circuit when a pulse at said second potential is received at said second terminal, output of said second logic level being maintained until a pulse at said first potential is received at said second terminal;

comparing a potential of said second terminal with a reference potential, said first logic level and said second logic level being supplied to said second electronic circuit responsive to a difference between the potential of said second terminal and said reference potential; and altering said reference potential responsive to the logic level supplied to said second electronic circuit.

20. The method of claim 19, wherein said pulse at said first potential and said pulse at said second potential have durations not exceeding one-half of a minimum interval between transitions of said binary logic signal.

21. The method of claim 19, wherein said first electronic circuit receives a ground potential and a power-supply potential, and said first potential and said second potential differ from one another by less than said ground potential and said power-supply potential differ from one another.

22. The method of claim 21, wherein said first potential and said second potential differ from one another by less than said low logic level and said high logic level differ from one another.

23. The method of claim 19, comprising the further step of terminating said transmission line at a potential intermediate between said first potential and said second potential.

24. The method of claim 23, wherein said transmission line has a characteristic impedance, and is terminated with a resistance matching said characteristic impedance.

25. The method of claim 19, wherein said first logic level is a low logic level and said second logic level is a high logic level.

26. The method of claim 19, wherein said first logic level is a high logic level and said second logic level is a low logic level.

27. A method of transmitting a binary logic signal from a first electronic circuit to a second electronic circuit over a transmission line, the transmission line coupled to said first electronic circuit by a first terminal and to said second electronic circuit by a second terminal, the method comprising:

transmitting a pulse having a first potential from said first terminal to said second terminal at each falling transition of said binary logic signal;

transmitting a pulse having a second potential, different from said first potential, from said first terminal to said second terminal at each rising transition of said binary logic signal;

maintaining said first terminal in a high-impedance state when no transitions occur in said binary logic signal;

comparing a potential of said second terminal with a reference potential;

continually applying a first logic level to said second electronic circuit when the potential of said second terminal is greater than the reference potential;

continually applying a second logic level to said second electronic circuit when the potential of said second terminal is less than the reference potential;

detecting changes in the logic level applied to the second electronic circuit; and altering said reference potential responsive to the detected changes.

* * * * *